(12) United States Patent
Umemoto et al.

(10) Patent No.: US 12,210,328 B2
(45) Date of Patent: Jan. 28, 2025

(54) CONTROL SUPPORT APPARATUS, CONTROL SUPPORT METHOD, COMPUTER READABLE MEDIUM WITH CONTROL SUPPORT PROGRAM RECORDED THEREON AND CONTROL SYSTEM

(71) Applicant: YOKOGAWA ELECTRIC CORPORATION, Tokyo (JP)

(72) Inventors: Hideki Umemoto, Tokyo (JP); Hirotsugu Gotou, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 920 days.

(21) Appl. No.: 17/229,900

(22) Filed: Apr. 14, 2021

(65) Prior Publication Data

US 2021/0333768 A1  Oct. 28, 2021

(30) Foreign Application Priority Data

Apr. 28, 2020 (JP) .................... 2020-079703

(51) Int. Cl.
*G05B 17/02* (2006.01)
*G05B 19/418* (2006.01)
(Continued)

(52) U.S. Cl.
CPC ......... *G05B 17/02* (2013.01); *G05B 19/4183* (2013.01); *G05B 19/4184* (2013.01);
(Continued)

(58) Field of Classification Search
CPC  G05B 17/02; G05B 19/4183; G05B 19/4184; G05B 19/41885; G05B 23/027
(Continued)

(56) References Cited

U.S. PATENT DOCUMENTS

2004/0049295 A1   3/2004  Wojsznis
2004/0138936 A1   7/2004  Johnson
(Continued)

FOREIGN PATENT DOCUMENTS

CN    107505922 A    12/2017
JP    H02259803 A    10/1990
(Continued)

OTHER PUBLICATIONS

Office Action issued for counterpart Japanese Application No. 2020-079703, issued by the Japan Patent Office on May 10, 2022 (drafted on Apr. 25, 2022).
(Continued)

*Primary Examiner* — Brian S Cook

(57) ABSTRACT

Provided is a control support apparatus, comprising: an equipment abnormality estimation section for estimating an abnormality of equipment based on measurement data by measuring the equipment; a simulation section for simulating a future state of the equipment when controlling the equipment by each of a plurality of candidate control methods according to an abnormality estimation result of the equipment; and a simulation abnormality estimation section for estimating a future abnormality of the equipment based on a future state of the equipment for each of the plurality of candidate control methods.

14 Claims, 8 Drawing Sheets

(51) Int. Cl.
*G05B 23/02* (2006.01)
*G06F 30/20* (2020.01)

(52) U.S. Cl.
CPC ..... *G05B 19/41885* (2013.01); *G05B 23/027* (2013.01); *G06F 30/20* (2020.01)

(58) Field of Classification Search
USPC .......................................................... 703/2
See application file for complete search history.

(56) References Cited

U.S. PATENT DOCUMENTS

| | | | | |
|---|---|---|---|---|
| 2010/0306001 | A1* | 12/2010 | Discenzo | G05B 23/0294 706/46 |
| 2013/0338964 | A1* | 12/2013 | Kobayashi | G06F 17/40 702/176 |
| 2018/0196400 | A1* | 7/2018 | Kobayashi | G06Q 50/06 |
| 2019/0094842 | A1 | 3/2019 | Lee | |
| 2021/0055712 | A1 | 2/2021 | Yasui | |

FOREIGN PATENT DOCUMENTS

| | | |
|---|---|---|
| JP | 2003005828 A | 1/2003 |
| JP | 2007272400 A | 10/2007 |
| JP | 2009009301 A | 1/2009 |
| JP | 2014002579 A | 1/2014 |
| JP | 2017167663 A | 9/2017 |
| JP | 2019197315 A | 11/2019 |

OTHER PUBLICATIONS

Office Action issued for counterpart Japanese Application No. 2020-079703, issued by the Japanese Patent Office on Nov. 22, 2022 (drafted on Nov. 15, 2022).
Office Action issued for counterpart Chinese Application 202110467126. X, issued by The State Intellectual Property Office of People's Republic of China on Sep. 29, 2023.
Office Action issued for counterpart Japanese Application No. 2020-079703, issued by the Japanese Patent Office on May 23, 2023 (drafted on May 18, 2023).
Extended European Search Report for counterpart European Application No. 21169332.0, issued by the European Patent Office on Sep. 27, 2021.

* cited by examiner

CONTROL SUPPORT APPARATUS, CONTROL SUPPORT METHOD, COMPUTER READABLE MEDIUM WITH CONTROL SUPPORT PROGRAM RECORDED THEREON AND CONTROL SYSTEM

The contents of the following Japanese patent application(s) are incorporated herein by reference:
NO. 2020-079703 filed in JP on Apr. 28, 2020

BACKGROUND

1. Technical Field

The present invention relates to a control support apparatus, a control support method, a computer readable medium with a control support program recorded thereon and a control system.

2. Related Art

Conventionally, a system, which uses a predictive model to estimate the state of equipment in plants or other facilities, and notifies workers when they have estimated that something is going wrong, is well known. When using such a system, workers need to make use of their experience and intuition to adjust the control parameters of the equipment so as to avoid the equipment from going into an abnormal state. Also, it is described in Patent Document 1 that "The simulator 40 includes a process simulator 42 that simulates the process 12 performed in the plant 3, and a control apparatus simulator 43 that simulates each of the control apparatuses 20 that respectively control the plurality of control target apparatuses 10. The process simulator 42 includes a control target apparatus simulator 41 that simulates each of the plurality of control target apparatuses 10 that constitute the process 12. The learning apparatus 2 is configured to determine a PID parameter that is used for determining the control operation amount for each control apparatus simulator 43, and input the parameter to the simulator 40, then learn the behavior of the plant 3 while repeating a step for obtaining the plurality of measurement values showing the result of control by using the input PID parameter for multiple times in time sequence, and then obtain a strategy for comprehensively determining the PID parameter that can make the plurality of control apparatuses 20 operate the plant 3 in a cooperative and stable way." (refer to paragraph 0046).

PRIOR ART DOCUMENT

Patent Document

Patent Document 1: Japanese Patent Application Publication No. 2019-197315.

SUMMARY

A first aspect of the present invention provides a control support apparatus. The control support apparatus may include an equipment abnormality estimation section for estimating an abnormality of equipment based on measurement data by measuring the equipment. The control support apparatus may include a simulation section for simulating a future state of the equipment when controlling the equipment by each of a plurality of candidate control methods according to an abnormality estimation result of the equipment. The control support apparatus may include a simulation abnormality estimation section for estimating a future abnormality of the equipment based on a future state of the equipment for each of the plurality of candidate control methods.

The control support apparatus may include a control instruction section for instructing a control apparatus of the equipment to control the equipment by a selected control method based on the simulation result from the plurality of candidate control methods.

The control instruction section may be configured to instruct the control apparatus to control the equipment by a selected control method based on a future abnormality of the equipment according to each of the plurality of candidate control methods.

The equipment abnormality estimation section and the simulation abnormality estimation section may be configured to estimate an abnormality of the equipment using a same estimation model.

The control support apparatus may include a factor detection section for detecting a factor parameter that has caused an abnormality of the equipment. The control support apparatus may include a candidate generation section for generating a control method for normalizing the factor parameter as at least one of the plurality of candidate control methods.

The control support apparatus may include a target acquisition section for acquiring an operation target of the equipment. The control support apparatus may include a candidate selection section for selecting a candidate control method that satisfies the operation target from the plurality of candidate control methods.

The control support apparatus may further include a presenting section for presenting an estimated abnormality by the simulation abnormality estimation section for at least one candidate control method from the plurality of candidate control methods.

The simulation section may be configured to perform a simulation for the first plurality of candidate control methods and the second plurality of candidate control methods. The control instruction section may be configured to instruct the control apparatus to control the equipment by a selected control method from the first plurality of candidate control methods, before a completion of a simulation for the second plurality of candidate control methods, in response to a completion of a simulation for the first plurality of candidate control methods. The control instruction section may be configured to instruct the control apparatus to control the equipment by a selected control method from candidate control methods including the second plurality of candidate control methods, in response to a completion of a simulation for the second plurality of candidate control methods.

The control support apparatus may include a candidate generation section for generating the first plurality of candidate control methods including a first candidate control method, and the second plurality of candidate control methods including a second control method candidate for adjusting a control parameter modified by the first candidate control method in a smaller range.

The candidate generation section may be configured to generate the second plurality of candidate control methods including the second control method candidate in response to a selection of the first candidate control method.

The control support apparatus may include a candidate generation section for generating the first plurality of candidate control methods including a first candidate control method, and the second plurality of candidate control methods including two or more second candidate control methods for changing control parameters that are changed by the first candidate control method into different magnitudes from each other.

The candidate generation section may be configured to generate the second plurality of candidate control methods including two or more of the second candidate control methods in response to a selection of the first candidate control method.

A second aspect of the present invention provides a control support apparatus. The control support apparatus may include an equipment abnormality estimation section for estimating an abnormality of equipment based on measurement data by measuring the equipment. The control support apparatus may include a simulation section for simulating a future state of the equipment when controlling the equipment by each of a plurality of candidate control methods according to an abnormality estimation result of the equipment. The control support apparatus may include a control instruction section for instructing a control apparatus of the equipment to control the equipment by a control method selected based on the simulation result from the plurality of candidate control methods.

A third aspect of the present invention provides a control system. The control system may include a control apparatus for controlling equipment. The control system may include a control support apparatus.

A fourth aspect of the present invention provides a control support method. The control support method may include estimating an abnormality of equipment based on measurement data by measuring the equipment by a control support apparatus for supporting controlling the equipment. The control support method may include simulating, by the control support apparatus, a future state of the equipment if the equipment is controlled by each of a plurality of candidate control methods according to an abnormality estimation result of the equipment. The control support method may include estimating a future abnormality of the equipment by the control support apparatus based on a future state of the equipment for each of the plurality of candidate control methods.

A fifth aspect of the present invention provides a control support method. The control support method may include estimating an abnormality of equipment by a control support apparatus for supporting controlling the equipment based on measurement data by measuring the equipment. The control support method may include simulating, by the control support apparatus, a future state of the equipment if the equipment is controlled by each of a plurality of candidate control methods according to an abnormality estimation result of the equipment. The control support method may include instructing, by the control support apparatus, a control apparatus of the equipment to control the equipment by a control method selected based on the simulation result from the plurality of candidate control methods.

A sixth aspect of the present invention provides a computer readable medium having recorded thereon a control support program executed by a computer. The control support program may cause the computer to perform operations of estimating an abnormality of equipment based on measurement data by measuring the equipment.

The control support program may cause the computer to perform operations of simulating, by the control support apparatus, a future state of the equipment if the equipment is controlled by each of a plurality of candidate control methods according to an abnormality estimation result of the equipment. The control support program may cause the computer to perform operations of instructing the control apparatus of the equipment to estimate a future abnormality of the equipment based on a future state of the equipment for each of the plurality of candidate control methods.

A seventh aspect of the present invention provides a computer readable medium having recorded thereon a control support program executed by a computer. The control support program may cause the computer to perform operations of estimating an abnormality of equipment based on measurement data by measuring the equipment. The control support program may cause the computer to perform operations of simulating, by the control support apparatus, a future state of the equipment if the equipment is controlled by each of a plurality of candidate control methods according to an abnormality estimation result of the equipment. The control support program may cause the computer to perform operations of instructing, by the control support apparatus, a control apparatus of the equipment to control the equipment by a control method selected based on the simulation result from the plurality of candidate control methods.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention, but the following embodiments do not limit the claimed invention. Moreover, not all combinations of features described in the embodiments are necessary to solutions of the invention.

Figure 1:
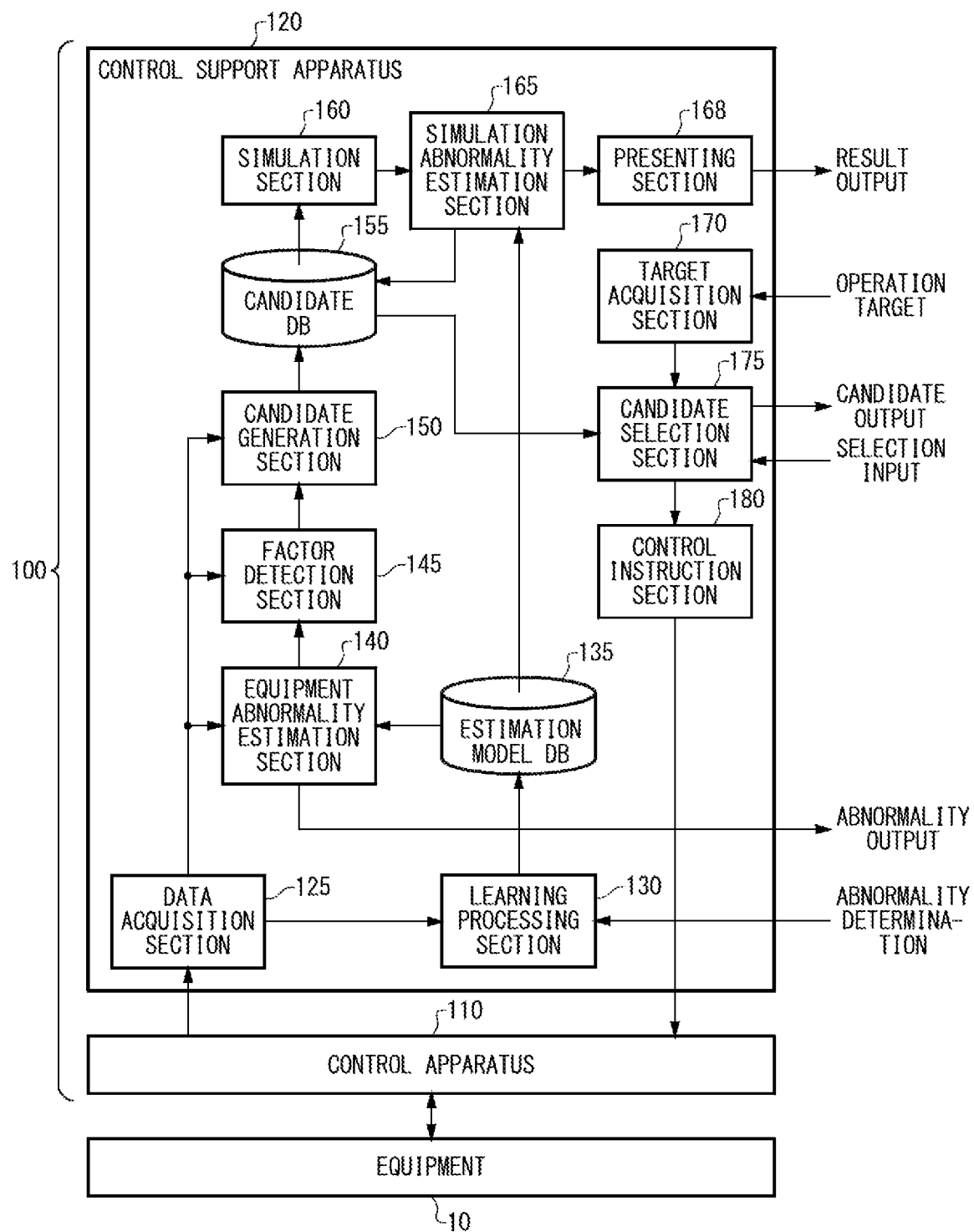
FIG. 1 illustrates a configuration of a control system 100 together with equipment 10 according to an embodiment of the present invention.

FIG. 1 illustrates a configuration of a control system 100 together with equipment 10 according to the present embodiment. The control system 100 according to the present embodiment simulates the future state of the equipment 10 when the equipment 10 is controlled by each of a plurality of candidate control methods in response to the estimated abnormality of the equipment 10. Next, the control system 100 allows the selection of a control method for the equipment 10 based on a simulation result. This allows the control system 100 to select a control method with a good simulation result, and enables the equipment 10 to maintain a normal state more reliably.

The equipment 10 is provided in a plant or the like. Such a plant may be, for example, an industrial plant such as a chemical or metal plant, a plant that manages and controls wellheads and their surroundings such as gas fields and oil fields, a plant that manages and controls electrical power generation such as hydro, thermal, and nuclear, a plant that manages and controls environmental electrical power generation such as solar and wind, a plant that manages and controls water supply and sewage, dams or the like, and so on. Also, the equipment 10 may be provided in a building or a transportation system or the like. Such equipment 10 may have one or more process apparatuses, one or more electrical power generation apparatuses and one or more other apparatuses.

The equipment 10 may have one or more field devices. A field device may be, for example, a sensor device such as a pressure gauge, a flow meter, or a temperature sensor or the like, a valve device such as a flow control valve, or an on-off valve, an actuator device such as a fan or a motor, an imaging device such as a camera or a video that captures images of the situation or objects in the plant or the like, an acoustic device such as a microphone or a speaker that collects abnormal noises or the like, or emits alarm sounds or the like in the plant, a position detection device that outputs the location information of the devices that the equipment 10 has, or other devices.

The control system 100 is connected to the equipment 10. The control system 100 may be a distribution control system (DCS), as one example. The control system 100 includes a control apparatus 110 and a control support apparatus 120. The control apparatus 110 is connected to the equipment 10, and configured to control the equipment 10. More specifically, the control apparatus 110 is configured to acquire measurement data from the equipment 10 measured by a measuring device such as a sensor provided in the equipment 10. The control apparatus 110 is configured to calculate a control parameter for controlling the equipment 10 by the PID calculation or the like, based on the measurement data acquired from the equipment 10, and set the calculated control parameter to the equipment 10. In this way, the equipment 10 performs processes such as changing the opening of a valve device, changing the operating amount of an actuator and so on according to the set control parameter.

The control support apparatus 120 is connected to the control apparatus 110, and configured to instruct the control method of the equipment 10 to the control apparatus 110. The control support apparatus 120 includes a data acquisition section 125, a learning processing section 130, an estimation model DB 135 (estimation model database 135), an equipment abnormality estimation section 140, an factor detection section 145, a candidate generation section 150, a candidate DB 155 (candidate database 155), a simulation section 160, a simulation abnormality estimation section 165, a presenting section 168, a target acquisition section 170, a candidate selection section 175 and a control instruction section 180.

The data acquisition section 125 is connected to the control apparatus 110, and configured to acquire the measurement data measured by the measuring device inside the equipment 10 via the control apparatus 110. The data acquisition section 125 may acquire all measurement data that can be acquired from the equipment 10, or may acquire some measurement data alternatively in a range that control support by the control support apparatus 120 is possible. Note that the data acquisition section 125 may acquire at least a part of the measurement data from the control apparatus 110 without going through the equipment 10. Also, the data acquisition section 125 may also acquire one or more control parameters set by the control apparatus 110 for the equipment 10 from the control apparatus 110.

The learning processing section 130 is connected to the data acquisition section 125, and configured to acquire measurement data from the data acquisition section 125. The learning processing section 130 is configured to use the acquired measurement data, and generate an estimation model by learning for estimating the abnormality of the equipment 10 as the input of the measurement data. The learning processing section 130 may generate an estimation model by learning without a teacher. Alternatively, the learning processing section 130 may also receive a determination result about whether the equipment 10 is abnormal ("abnormality determination" in the figure) from a skilled operator or the like, and use the result as a teacher data, then generate an estimation model by learning with a teacher.

Herein, in the present embodiment, the "abnormality" of the equipment 10 is an indicator showing the soundness of the equipment 10 ("soundness indicators"), and a value that increases as the soundness of the equipment 10 becomes higher (that is, the possibility of being normal becomes higher), and decreases as the soundness of the equipment 10 becomes lower (that is, the possibility of being abnormal becomes higher). Alternatively, the "abnormality" may be a value indicating "the degree of abnormality" that increases as the possibility of being abnormal becomes higher, and decreases as the possibility of being normal becomes higher for the equipment 10. Also, the abnormality may be a flag value showing a value indicating normality when estimated as normal (for example, "0"), and a value indicating abnormality when estimated as abnormal (for example, "1"). Note that the case in which the soundness of the equipment 10 is low, that is, the possibility of being abnormal is higher, does not necessarily indicate that the equipment 10 is currently abnormal, as it may also indicate the case in which a sign of becoming abnormal in the future has been detected, although the equipment 10 is currently normal. In other words, the "abnormalities" of the equipment 10 grasped by using the "abnormality" of the equipment 10 does not indicate the current failure or the like of the equipment 10 itself, but may also include a state that is not appropriate for the operations of the equipment 10, such as a state in which the equipment 10 is headed for failure in the future.

The estimation model DB 135 is connected to the learning processing section 130, and configured to store an estimation model learnt by the learning processing section 130. The equipment abnormality estimation section 140 is connected to the data acquisition section 125 and the estimation model DB 135. The equipment abnormality estimation section 140 is configured to estimate the most recent abnormality of the equipment 10 based on the measurement data acquired by the data acquisition section 125 by using the stored estimation model in the estimation model DB 135. The equipment abnormality estimation section 140 is configured to output the estimated abnormality to an operator or the like, or an external instrument or the like ("abnormality output" in the figure).

The factor detection section 145 is connected to the data acquisition section 125 and the equipment abnormality estimation section 140, and configured to detect at least one factor parameter that causes abnormalities of the equipment 10. For example, in the case where the equipment abnormality estimation section 140 has estimated an abnormality of the equipment 10, for example, in response to the fact that the pressure of the process apparatus A exceeds the learnt normal range, the factor detection section 145 is configured to detect an abnormality of the pressure parameter (factor parameter) of the process apparatus A when an abnormality of the equipment 10 has been estimated. Also, the factor detection section 145 is configured to detect an abnormality in the temperature parameter (factor parameter) of a pipe B, for example, when it is estimated that there is an abnormality in the equipment 10 in response to the temperature of the pipe B being above the learnt normal range.

The candidate generation section 150 is connected to the data acquisition section 125 and the factor detection section 145, configured to generate a plurality of candidates of the control method (candidate control methods) for controlling the equipment 10 and store them in the candidate DB 155. Herein, the candidate generation section 150 may generate a candidate control method including a set value to be set for at least one control parameter of the equipment 10, and store it in the candidate DB 155. Furthermore, the candidate generation section 150 may store the set value of each control parameter of the equipment 10 and the measurement data of the equipment 10 in the candidate DB 155 to be used for simulation according to the current situation.

The candidate generation section 150 may generate a control method for normalizing at least one factor parameter detected by the factor detection section 145 as at least one of the plurality of candidate control methods. For example, when the pressure of the process apparatus A is above the learnt normal range, the candidate generation section 150 is configured to generate a control method that includes a new set value of control parameters for this valve to reduce the inflow of raw material by squeezing the valve of the pipe that supplies the gas or liquid raw material to the process apparatus A. For another example, when the temperature of the pipe B is above the learnt normal range, the candidate generation section 150 is configured to generate a control method that includes a new set value of control parameters for this heating device to reduce the heating rate of the heating device upstream of the pipe B.

The candidate DB 155 is connected to the candidate generation section 150 and the simulation abnormality estimation section 165. The candidate DB 155 is configured to store the candidate control method generated by the candidate generation section 150. Also, the candidate DB 155 may store the set value of each control parameter of the equipment 10 and the measurement data of the equipment 10 in the current situation.

The simulation section 160 is connected to the candidate DB 155. The simulation section 160 is configured to simulate the future state of the equipment 10 when the equipment 10 is controlled by each of the plurality of candidate control methods stored in the candidate DB 155 according to the estimation result of the abnormality of the equipment 10. The simulation section 160 according to the present embodiment is configured to perform a simulation using each of the plurality of candidate control methods generated by the candidate generation section 150 based on the factor parameter detected by the factor detection section 145 in response to the estimation of abnormality of the equipment 10 by the equipment abnormality estimation section 140. The simulation section 160 is configured to calculate by this simulation at least some of the measurement data that is assumed to be measured from the equipment 10 in the future as the future state of the equipment 10. Also, the simulation section 160 may calculate the production volume of the equipment 10, the period during which production or the like can be maintained without stopping the equipment 10 (equipment maintenance period), and other control results of the equipment 10 as at least some of the future state of the equipment 10. The simulation section 160 may store the future state of the equipment 10, such as the measurement data calculated for each candidate control method, in the candidate DB 155 corresponding to that candidate control method.

The simulation abnormality estimation section 165 is connected to the estimation model DB 135 and the simulation section 160. The simulation abnormality estimation section 165 is configured to estimate the future abnormality of the equipment 10 based on the future state of the equipment 10 simulated by the simulation section 160 for each of the plurality of candidate control methods stored in the candidate DB 155. In the present embodiment, the equipment abnormality estimation section 140 and the simulation abnormality estimation section 165 are configured to estimate the abnormality of the equipment 10 using the same estimation model stored in the estimation model DB 135. Herein, the simulation abnormality estimation section 165 is configured to estimate the future abnormality of the equipment 10 based on the measurement data of the equipment 10 and the control results of the equipment 10 assumed in the future, which are calculated by the simulation. The simulation abnormality estimation section 165 is configured to store the future abnormality of the equipment 10, calculated for each of the plurality of candidate control methods, in the candidate DB 155 as at least some of the simulation results, corresponding to each candidate control method.

The presenting section 168 is connected to the simulation abnormality estimation section 165. The presenting section 168 is configured to present the simulation results, including the abnormality estimated by the simulation abnormality estimation section 165, for at least one of the plurality of candidate control methods to the operator of the equipment 10. Herein, the presenting section 168 may also present the estimated abnormality for each of the plurality of candidate control methods, together with the measurement data or other data calculated by the simulation section 160.

The target acquisition section 170 is configured to acquire an operation target of the equipment 10 from the operator or the like of the equipment 10. The candidate selection section 175 is connected to the candidate DB 155 and the target acquisition section 170. The candidate selection section 175 is configured to select a control method to be used for controlling the equipment 10 from the plurality of candidate control methods stored in the candidate DB 155, based on the simulation results for each candidate control method. Herein, the candidate selection section 175 is configured to select the control method to be used for controlling the equipment 10 based on the future abnormality of the equipment 10 according to each of the plurality of candidate control methods, which are obtained as at least some of the simulation results. Also, when the operation target of the equipment 10 has been designated, the candidate selection section 175 is configured to select a control method that further satisfies the designated operation target among the plurality of candidate control methods.

Among the plurality of candidate control methods, the candidate selection section 175 may automatically select a control method that can achieve the operation target if the predicted abnormal state of the equipment 10 is to be eliminated according to the simulation result and an operation target is to be designated. Also, the candidate selection section 175 may display the simulation results of each of the plurality of candidate control methods to the operator or the like ("candidate output" in the figure), and the operator or the like may select a control method by inputting the designation of the control method selected based on the simulation result ("selection input" in the figure). Also, the candidate selection section 175 may narrow down two or more candidate control methods among the plurality of candidate control methods that can improve the state of the equipment 10, which is predicted to be abnormal, and bring it closer to achieving the operation target, and display the methods to the operator or the like, and select one control method according to the designation of the operator or the like.

The control instruction section 180 is connected to the candidate selection section 175. The control instruction section 180 is configured to instruct the control apparatus 110 of the equipment 10 to control the equipment 10 by the control method selected among the plurality of candidate control methods based on the simulation result including the estimation result of the future abnormality of the equipment 10. The control apparatus 110 is configured to control the equipment 10 by the control method designated by the control instruction section 180.

According to the control system 100 shown above, it is possible to estimate the abnormality of the equipment 10, generate a plurality of candidate control methods for the equipment 10 in accordance with the estimation that an abnormality will occur, and simulate the future state of the equipment 10 when the equipment 10 is controlled by each candidate control method. Then, the control system 100 can control the equipment 10 by selecting the control method that had the best simulation result from the plurality of candidate control methods. In this way, the control system 100 can control the equipment 10 more reliably and accurately using the simulation result.

Figure 2:
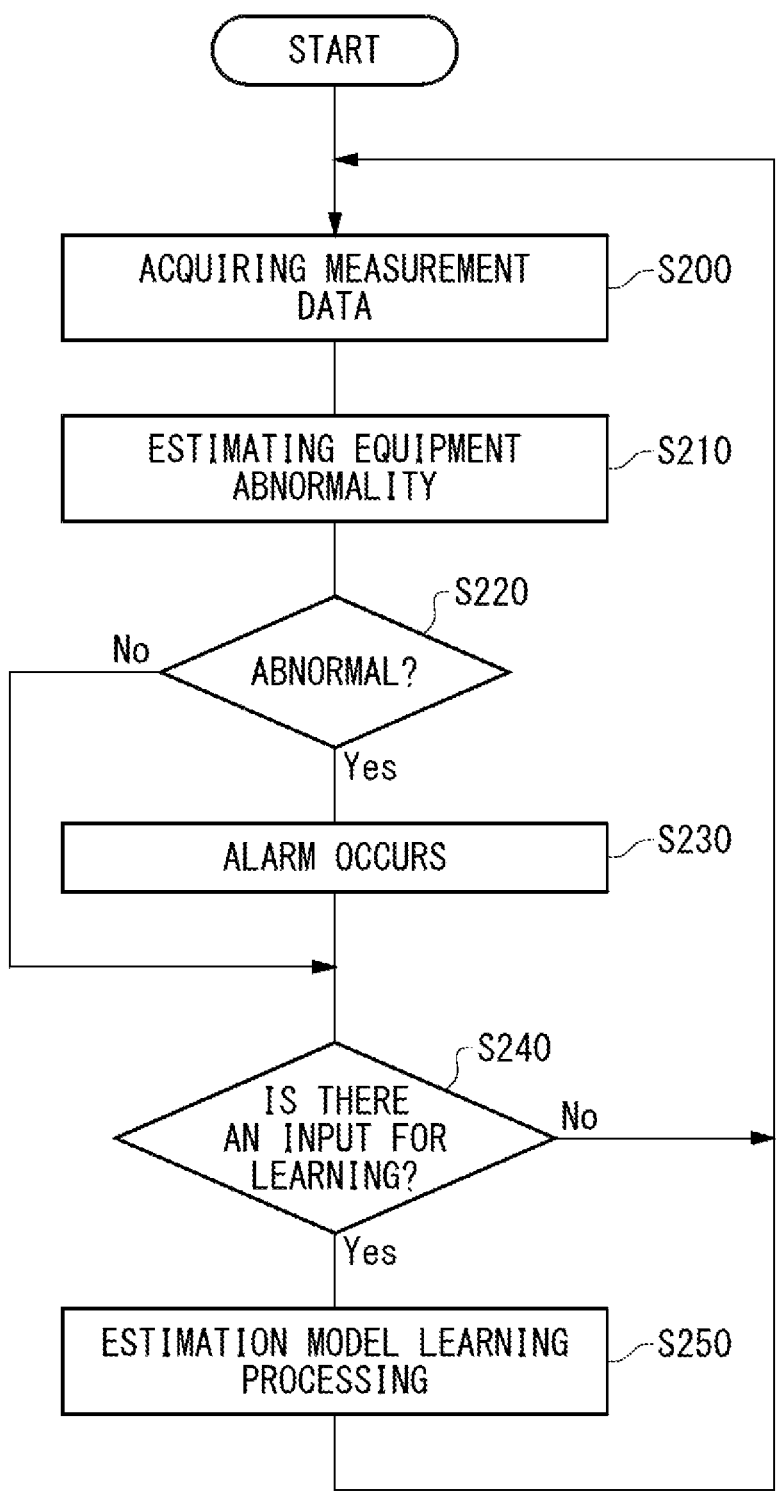
FIG. 2 illustrates a learning flow of the control system 100 according to an embodiment of the present invention.

FIG. 2 illustrates a learning flow of the control system 100 according to the present embodiment. In step 200 (S200), the data acquisition section 125 is configured to acquire the measurement data of the equipment 10 collected by the control apparatus 110 from the control apparatus 110 at a predetermined cycle, such as several seconds, for example. Herein, the data acquisition section 125 may acquire measurement data at the same cycle as the control apparatus 110 acquires measurement data for controlling the equipment 10, or may acquire measurement data at a cycle larger than the acquisition cycle of the control apparatus 110 for the purpose of monitoring the equipment 10.

In S210, the equipment abnormality estimation section 140 is configured to estimate the abnormality of the equipment 10 based on the measurement data acquired by the data acquisition section 125. If the equipment 10 has been estimated to be abnormal in S220, the equipment abnormality estimation section 140 is configured to notify the operator or the like of the abnormality of the equipment 10 by generating an alarm or the like in S230 ("abnormality output" in FIG. 1).

In S240, the learning processing section 130 is configured to determine whether or not there is an input of a determination result ("abnormality determination" in FIG. 1) regarding the normal or abnormal condition of the equipment 10 from the operator or the like. Note that the learning processing section 130 may provide a user interface, such as allowing the operator or the like to designate the period when the equipment 10 has been abnormal after the fact, so as not to require excessive real-time input of the abnormality determination from the operator or the like.

If there is an input of a determination result in S240, the learning processing section 130 is configured to perform the learning processing of the estimation model using the input of this determination result as the input for learning in S250.

Herein, if the learning processing takes time, the learning processing section 130 may perform the learning processing by batch processing or other means outside the loop of periodically acquiring measurement data and abnormality estimation.

The estimation model to estimate the abnormality of the equipment 10 may use a neural network, a support vector machine (SVM), or other machine learning model. For example, in the case of using a neural network, the learning processing section 130 is configured to adjust the weights between each neuron and the bias of each neuron using back-propagation or other methods to minimize the error between the abnormality estimation result and the target abnormality determination result output from the output layer when the measurement data acquired from the equipment 10 is input to the input layer of the neural network.

Also, for example, in the case of using SVM, the learning processing section 130 is configured to learn the hyperplane that separates the set of points labeled as normal for the equipment 10 from the set of points labeled as abnormal for the equipment 10 when the points with coordinates of one or more pairs of measurement values in the measurement data acquired from the equipment 10 are mapped in the multidimensional space. This hyperplane is represented by a weight vector including a pair of weights corresponding to each measurement value.

Note that it is very rare that the equipment 10 such as a plant becomes an abnormal in reality. Therefore, the learning processing section 130 may perform the learning processing of the estimation model assuming that the equipment 10 is normal when the determination saying the equipment 10 is abnormal has not been input.

Instead of the above, the estimation model for estimating the abnormality of the equipment 10 may be based on a statistical method. For example, the learning processing section 130 is configured to accumulate the measurement data acquired at each timing in the estimation model DB 135. The estimation model DB 135 may then estimate that the equipment 10 is abnormal in response to the acquisition of measurement data that deviates equal to or more than a threshold value from the distribution of measurement data accumulated in the estimation model DB 135. Also, the estimation model may estimate that the equipment 10 becomes abnormal in response to a pre-programmed condition (for example, the temperature of the pipe B is 85 degrees or higher, or other) having been satisfied.

Figure 3:
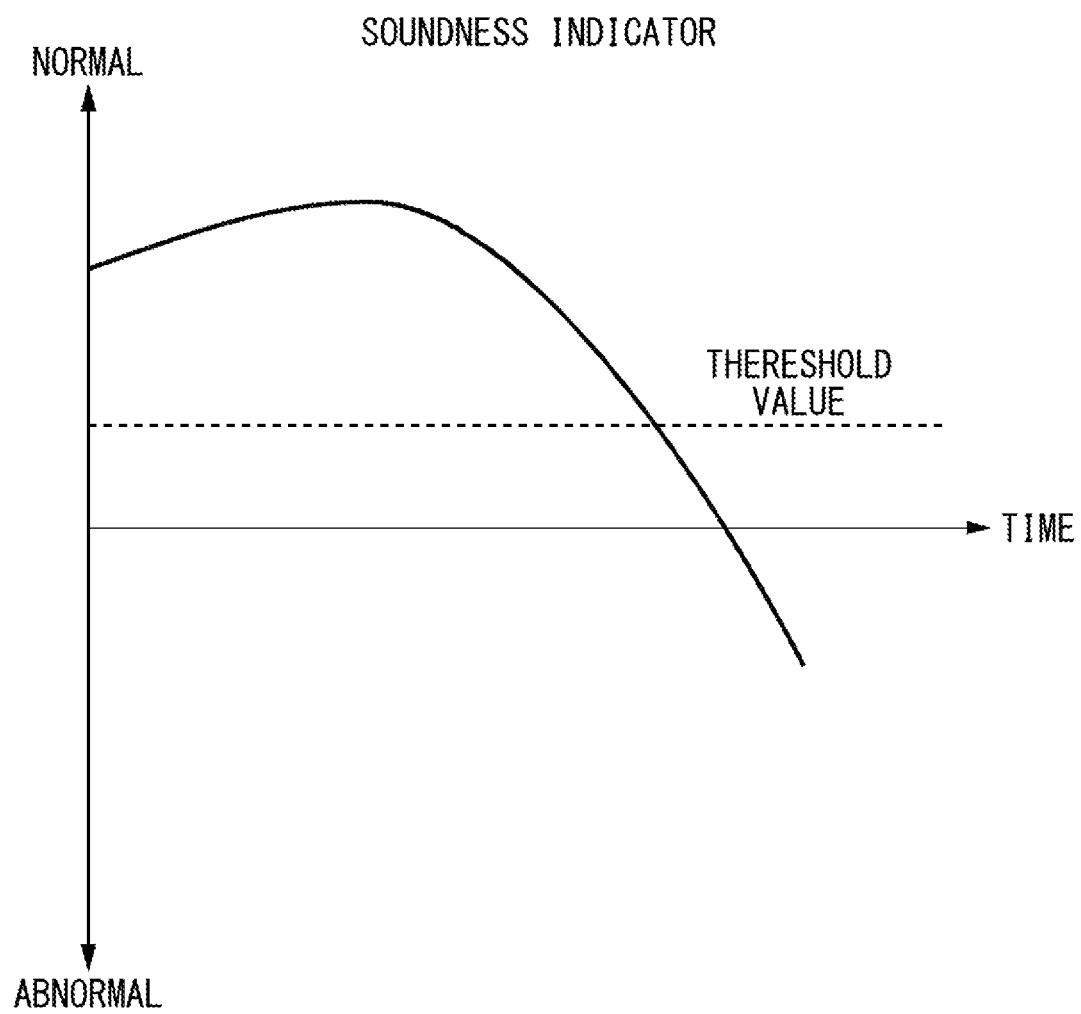
FIG. 3 illustrates one example of a graph showing soundness indicators according to an embodiment of the present invention.

FIG. 3 illustrates one example of a graph of soundness indicators showing the abnormality of the equipment 10 according to the present embodiment. The soundness indicators according to the present embodiment takes a value that is smaller as the possibility for the equipment 10 being abnormal becomes higher, and larger as the possibility for the equipment 10 being normal (for example, −1.0 to +1.0) becomes higher, within a predetermined numerical range. For example, when using an estimation model with a neural network educated to output +1 in a normal case and −1 in an abnormality case from an output node, the equipment abnormality estimation section 140 may use the output value of this output node as a soundness indicator. For another example, in the case of using a estimation model with a statistical method, the equipment abnormality estimation section 140 may use a value indicating how close the acquired measurement data is to the distribution of the measurement data accumulated in the estimation model DB 135 (for example, an inverse correlation of a value indicating how far it deviates from the distribution) as a soundness indicator.

The equipment abnormality estimation section 140 is configured to calculate such a soundness indicator based on the acquired measurement data every time the measurement data of the equipment 10 is acquired, and display it to the operator or the like, using graphs and so on as exemplified in FIG. 3. The equipment abnormality estimation section 140 according to the present embodiment is configured to estimate that the equipment 10 is normal when the soundness indicator value is greater than a threshold value indicating the boundary between normal and abnormal, and estimate that the equipment 10 is abnormal when the soundness indicator value is less than or equal to the threshold value. Herein, the equipment abnormality estimation section 140 may use different values for the threshold used to determine the opportunity to generate a plurality of candidate control methods and run a simulation, and the threshold used to warn the operator or the like of the abnormality of the equipment 10 by an alarm or other means. For example, the equipment abnormality estimation section 140 may make the threshold used to determine the opportunity to run the simulation larger than the threshold used to warn the operator or the like and start the simulation ahead of time when there is a possibility of issuing an alert in the future.

The equipment abnormality estimation section 140 may also estimate the abnormality of the equipment 10 using other conditions, such as a decreasing trend in the soundness indicator. This allows the equipment abnormality estimation section 140 to run a pre-simulation in a situation where an abnormality may occur in the future, and to switch the control method of the equipment 10.

Figure 4:
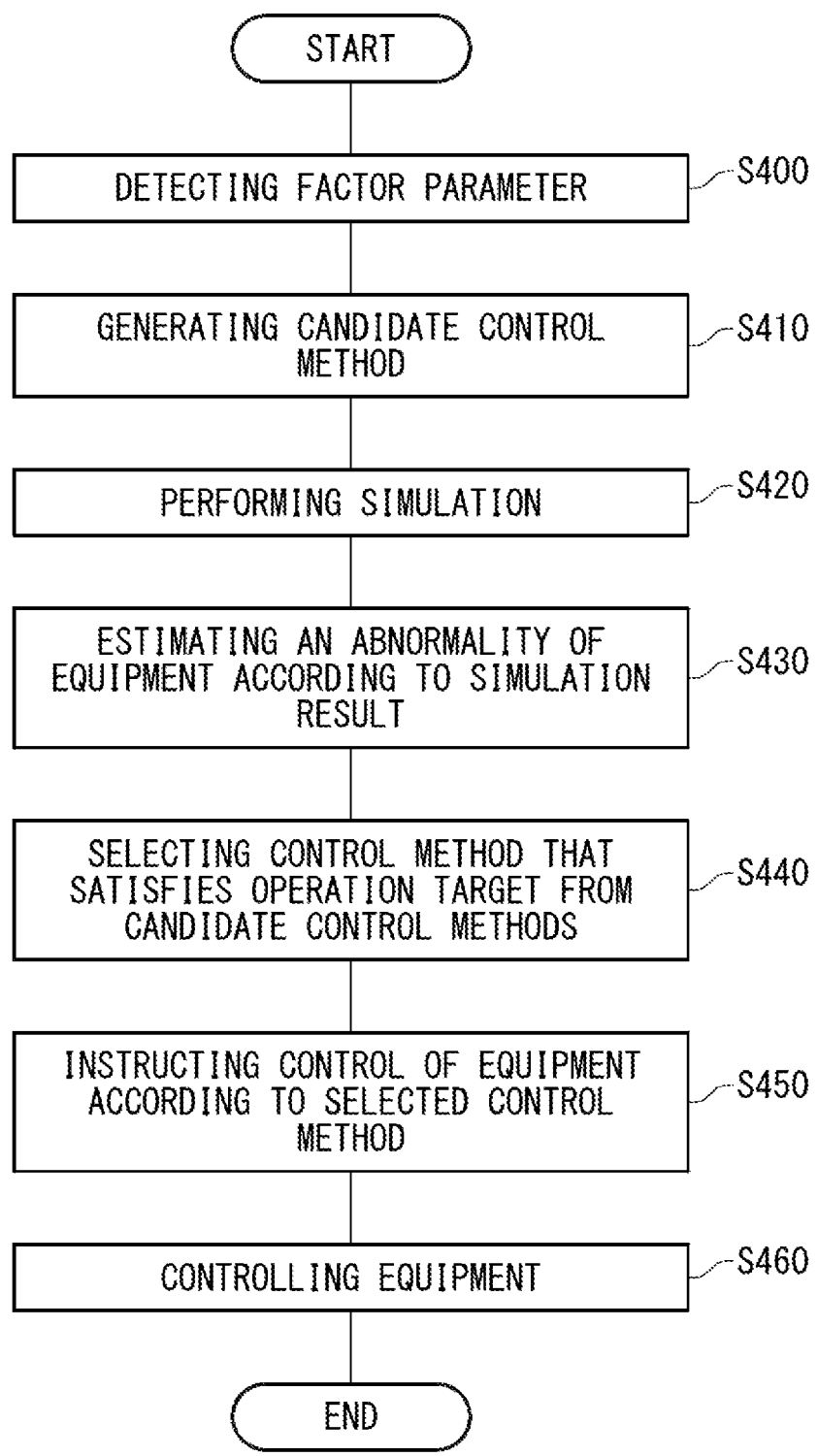
FIG. 4 illustrates a control support flow of the control system 100 according to an embodiment of the present invention.

FIG. 4 illustrates a control support flow of the control system 100 according to the present embodiment. In S400, the factor detection section 145 is configured to detect at least one factor parameter that has caused the equipment abnormality estimation section 140 to estimate the abnormality of the equipment 10. In the case where the estimation model uses a neural network, the equipment abnormality estimation section 140 may calculate the error of each measurement value of the measurement data input to the input layer of the neural network by, for example, back-propagating the error between the soundness indicator value indicating normal (for example, +1.0) and the soundness indicator value when an abnormality is estimated, from the output layer to the input layer of the neural network. The equipment abnormality estimation section 140 may detect at least one parameter corresponding to the measurement value with a relatively large error calculated in this way as the factor parameter that has caused the abnormality.

Also, for example, when the estimation model uses a statistical method, the equipment abnormality estimation section 140 may detect at least one parameter corresponding to the measurement value that has been a factor that deviates from the distribution of the measurement data accumulated in the estimation model DB 135 among the measurement values for each of the plurality of parameters as a factor parameter. Also, if the estimation model is to determine the abnormality of the equipment 10 using pre-programmed conditions, the equipment abnormality estimation section 140 may detect the reference parameter as a factor parameter in the condition determination that has not been satisfied among the plurality of conditions to be satisfied by the measurement data.

In S410, the candidate generation section 150 is configured to generate candidate control methods that normalize at least one factor parameter detected by the factor detection section 145, and store them in the candidate DB 155. For example, the candidate generation section 150 may have a relationship in advance between each of the plurality of control parameters and at least one parameter whose measurement value can be changed by changing the control parameter. The candidate generation section 150 uses this relationship to identify at least one control parameter that can be used to adjust the at least one factor parameter detected by the factor detection section 145. Then, the candidate generation section 150 is configured to generate one or more candidate control methods that modify the identified control parameter.

For example, when the pressure of process apparatus A has been detected as a factor parameter, the candidate generation section 150 is configured to identify the control parameter that affects the pressure of process apparatus A, such as the valve opening setting of the pipe upstream of the process apparatus A and the reaction rate setting of the process apparatus A. Then, the candidate generation section 150 is configured to generate a candidate control method that opens this valve more, a candidate control method that closes this valve more, a candidate control method that makes the reaction rate of the process apparatus A smaller, a candidate control method that makes the reaction rate of the process apparatus A larger, and so on. Herein, the candidate generation section 150 may have a relationship in advance between the increase or decrease of the control parameter and the increase or decrease of the factor parameter, in which case it may generate a candidate control method that changes the control parameter in the direction that normalizes the factor parameter.

Also, the candidate generation section 150 may generate a plurality of candidate control methods with different change amounts for the same control parameter. For example, the candidate generation section 150 may generate a plurality of candidate control methods such that a certain control parameter is varied by +1, +5, +10, +20 and so on.

Also, the candidate generation section 150 may also generate a candidate control method for maintaining the control method currently in operation. By also running a simulation for the candidate control methods that include the control method currently in operation, the candidate selection section 175 can select a candidate control method according to the control method currently in operation and other candidate control methods based on the result obtained by the same simulation.

In S420, the simulation section 160 is configured to simulate the future state of the equipment 10 when controlled by each of the plurality of candidate control methods stored in the candidate DB 155. As one example, the simulation section 160 may calculate the steady state of the equipment 10 by static simulation. In a static simulation, each device inside the equipment 10 is represented by a simulation model that mathematically simulates the operations of that device. For example, a process apparatus inside the equipment 10 may be represented by a simulation model in which the reaction rate or other parameters are set by control parameters and output an amount of intermediate product that is calculated using the external environment of that process apparatus, such as the input rate of the raw material or other, and the internal condition of that process apparatus.

Also, the simulation section 160 may calculate the state change of the equipment 10 by a dynamic simulation. For example, the simulation section 160 may analyze a change over time in the state of the equipment 10 by means of fluid or thermodynamic simulations or the like using the finite element method or other methods.

Also, the simulation section 160 may also perform a simulation including a simulation model for simulating the operations of the control apparatus 110. For example, when the control apparatus 110 performs PID control or the like, the simulation section 160 may simulate the process of the control apparatus 110 changing the set value of the control parameter of the equipment 10 over time by PID control or the like, after the control support apparatus 120 sets the control parameter in the control apparatus 110.

In S430, the simulation abnormality estimation section 165 is configured to estimate the future abnormality of the equipment 10 based on the simulation result by the simulation section 160 for each of the plurality of candidate control methods, that is, the measurement data of the equipment 10 assumed in the future calculated by the simulation. The simulation abnormality estimation section 165 may estimate the future abnormality of the equipment 10 using the same method as the equipment abnormality estimation section 140. The simulation abnormality estimation section 165 according to the present embodiment is configured to estimate the future abnormality of the equipment 10 using the estimation model stored in the estimation model DB 135. Herein, when the simulation section 160 performs a dynamic simulation, the simulation abnormality estimation section 165 may estimate the indicator value of the abnormality of the equipment 10 at each time point in the future.

In S440, the candidate selection section 175 is configured to select a control method to be used for controlling the equipment 10 among a plurality of candidate control methods stored in the candidate DB 155, based on the simulation result by the simulation section 160 and the determination result of the future abnormality by the simulation abnormality estimation section 165. Herein, the candidate selection section 175 is configured to select one among the plurality of candidate control methods whose future soundness indicator values are greater than the threshold values that indicate the boundary between normal and abnormal, as shown in FIG. 3. The candidate selection section 175 may select a plurality of candidate control methods with a higher priority for those with a higher soundness indicator value. Also, if the simulation section 160 is configured to perform a dynamic simulation, the candidate selection section 175 may select, with a higher priority, the one among the plurality of candidate control methods for which the soundness indicator value becomes greater than the threshold value earlier.

Also, the target acquisition section 170 may also acquire the operation target of the equipment 10 upon request from the operator or the like of the equipment 10. When the operation target has been acquired, the candidate selection section 175 is configured to select the control method that satisfies the designated operation target among the plurality of candidate control methods. The operation target may include at least one target value such as production volume, occupancy rate, load, or equipment maintenance time for the entire equipment 10 or at least one apparatus. The candidate selection section 175 may select a plurality of candidate control methods with a higher priority for those with a higher achievement rate of the operation target. Also, the candidate selection section 175 may score each candidate control method by weighting the soundness indicator value, the achievement rate of the operation target, and other selection indicator, and select the control method with the highest score.

Also, the candidate selection section 175 may display a plurality of candidate control methods, or a part thereof, to the operator or the like, and allow the operator or the like to determine one control method. In this case, the candidate selection section 175 may display two or more candidate control methods that are estimated to have normal soundness indicators values and satisfy the designated operation targets to the operator or the like.

In S450, the control instruction section 180 is configured to instruct the control apparatus 110 to control the equipment 10 by the selected control method in S440. For example, the control instruction section 180 instructs the control apparatus 110 to actually change the values of the control parameters that are scheduled to be changed in the selected control method. In S 460, the control apparatus 110 is configured to control the equipment 10 according to the selected control method upon an instruction from the control instruction section 180.

According to the control system 100 shown above, when an abnormality of the equipment 10 is estimated to occur, a plurality of candidate control methods of the equipment 10 can be generated and simulated respectively, and the control method with good simulation results can be selected to control the equipment 10. This allows the control system 100 to more reliably recover the equipment 10 from a state that may be heading toward an abnormality, and also allows the equipment 10 to be operated by selecting a control method that can satisfy the operation target of the equipment 10.

Note that the control support apparatus 120 does not need to include all of the above-mentioned functions and configurations and can control the equipment 10 suitably even when some of the functions or configurations are not present. For example, the candidate generation section 150 may generate at least one candidate control method at any time or in a predetermined cycle and so on regardless of whether or not an abnormality of the equipment 10 has been estimated, and have the simulation section 160 simulate it. In this case, the control support apparatus 120 can select a better candidate control method even when no abnormality of the equipment 10 is estimated.

Also, the control support apparatus 120 may employ a configuration without a simulation abnormality estimation section 165. In this case, the control support apparatus 120 does not estimate the future abnormality based on the simulation result, but can provide a plurality of candidate control method options to the skilled operator or the like who can determine the abnormality from the simulation result.

Also, the control support apparatus 120 may employ a configuration without a target acquisition section 170. In this case, the control support apparatus 120 may select a control method based on the estimated result of the future abnormality, or it may determine a control method selected from two or more candidate control methods estimated to be normal in the future, based on the criteria of the operator or the like.

Also, the control support apparatus 120 may also employ a configuration without a target acquisition section 170, a candidate selection section 175 and a control instruction section 180. In this case, the control support apparatus 120 is configured to generate a plurality of candidate control methods and simulate each of them, estimate the future abnormality, and present the result to the operator or the like. In this case, the operator or the like can manually set the control parameter to the equipment 10 or the control apparatus 110 based on the control method selected by checking the presented simulation result among the plurality of candidate control methods.

Figure 5:
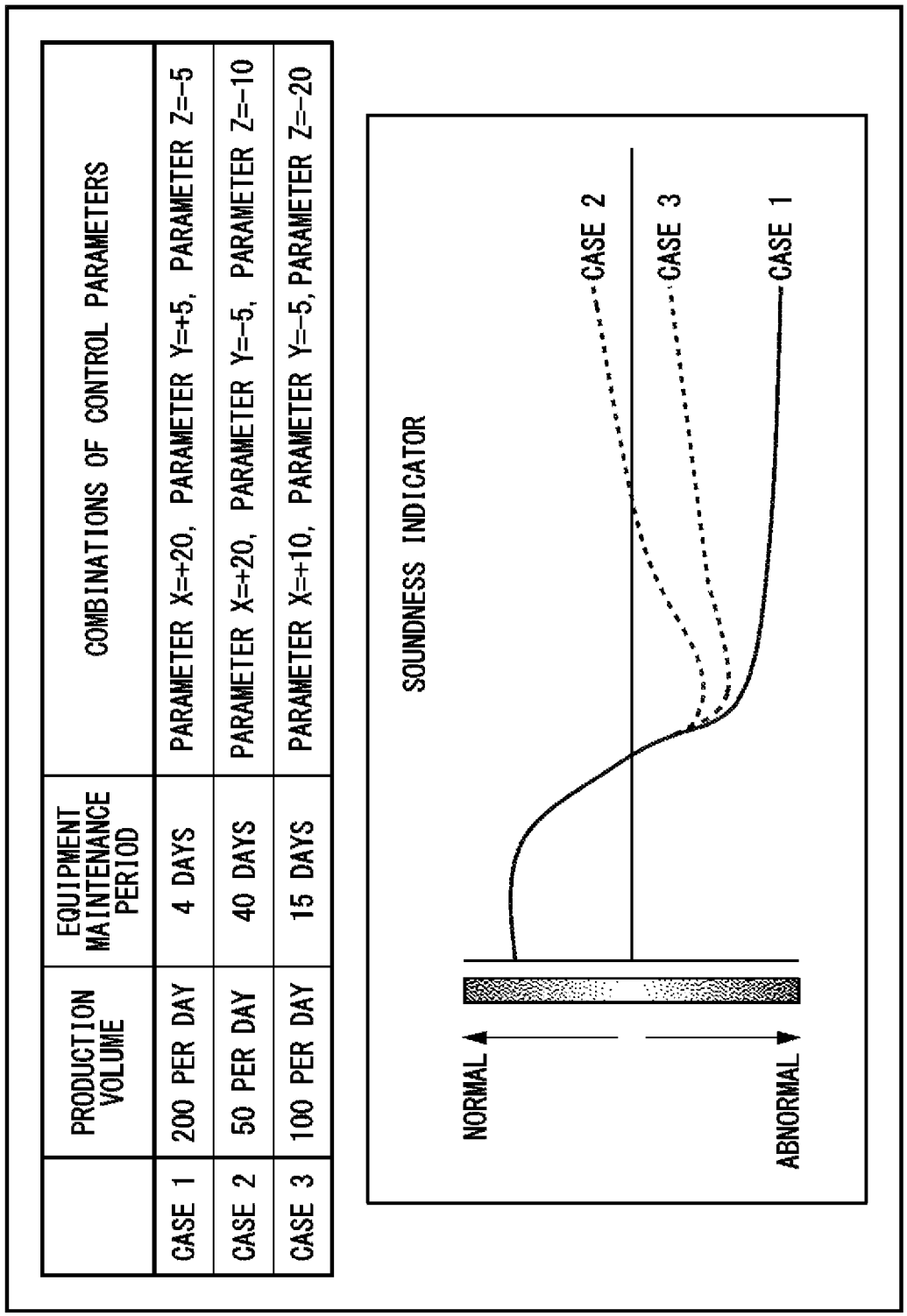
FIG. 5 illustrates one example of a display screen 500 output by the control system 100 according to an embodiment of the present invention.

FIG. 5 illustrates one example of a display screen 500 output by the control system 100 according to the present embodiment. In the example of this figure, the candidate generation section 150 is configured to generate the candidate control method of cases 1 to 3 in S 410 shown in FIG. 4. Case 1 is to increase the control parameter X by 20, increase the control parameter Y by 5, and decrease the control parameter Z by 5. In case 1, the other control parameters do not change. Similarly in case 2, the control parameter X is increased by 20, the control parameter Y is decreased by 5, and the control parameter Z is decreased by 10. Case 3 similarly increases the control parameter X by 10, decreases the control parameter Y by 5, and decreases the control parameter Z by 20.

The simulation section 160 is configured to execute the simulation for cases 1 to 3 in S 420 shown in FIG. 4. In the example shown in this figure, the simulation section 160 is configured to calculate, as the future state of the equipment 10, that the production volume of the equipment 10 is 200 per day in case 1, 50 per day in case 2, and 100 per day in case 3, and that the equipment maintenance period of the equipment 10 is 4 days in case 1, 40 days in case 2, and 15 days in case 3, by a simulation.

The simulation abnormality estimation section 165 is configured to estimate the soundness indicator value of the equipment 10 in the future based on the simulation result for each of the cases 1 to 3 in S430 shown in FIG. 4. In the example shown in this figure, the soundness indicator recovers to normal in case 2, but in cases 1 and 3, the soundness indicator does not recover to normal within the period shown in the figure.

The candidate selection section 175 is configured to present the simulation result of cases 1 to 3 to the operator or the like in S 440 shown in FIG. 4. Then, the candidate selection section 175 is configured to select the control method for case 2 in which the soundness indicator recovers to normal based on the future soundness indicator of the equipment 10 for each of cases 1 to 3. In the example of this figure, the candidate selection section 175 may automatically select the control method for case 2, which is estimated to recover the soundness indicator to normal among cases 1 to 3. Alternatively, the candidate selection section 175 may select a control method instructed by the operator or the like from cases 1 to 3.

In response to the selection by the candidate selection section 175, the control instruction section 180 is configured to instruct the control apparatus 110 to increase the control parameter X by 20, decrease the control parameter Y by 5, and decrease the control parameter Z by 10, and the control apparatus 110 is configured to control the equipment 10 in response to this instruction.

In the example of this figure, if the soundness indicator recovers to normal in any of cases 1 to 3, the candidate selection section 175 may select any of the control methods based on the operation target. For example, if the operation target is to maximize the production volume or to increase the production volume to 150 or more per day or the like, the candidate selection section 175 is configured to select case 1, which satisfies the operation target. Also, if the operation target is to maximize the equipment maintenance period or to maintain the equipment maintenance period for 30 days or more or the like, the candidate selection section 175 is configured to select case 2 that satisfies the operation target. Also, if the operation target is to achieve a production volume of 80 or more per day and an equipment maintenance period of 10 days or more or the like, the candidate selection section 175 is configured to select case 3 that satisfies the operation target.

In this way, the control system 100 can control the equipment 10 by selecting an appropriate control method based on the simulation result of each of the plurality of candidate control methods.

Figure 6:
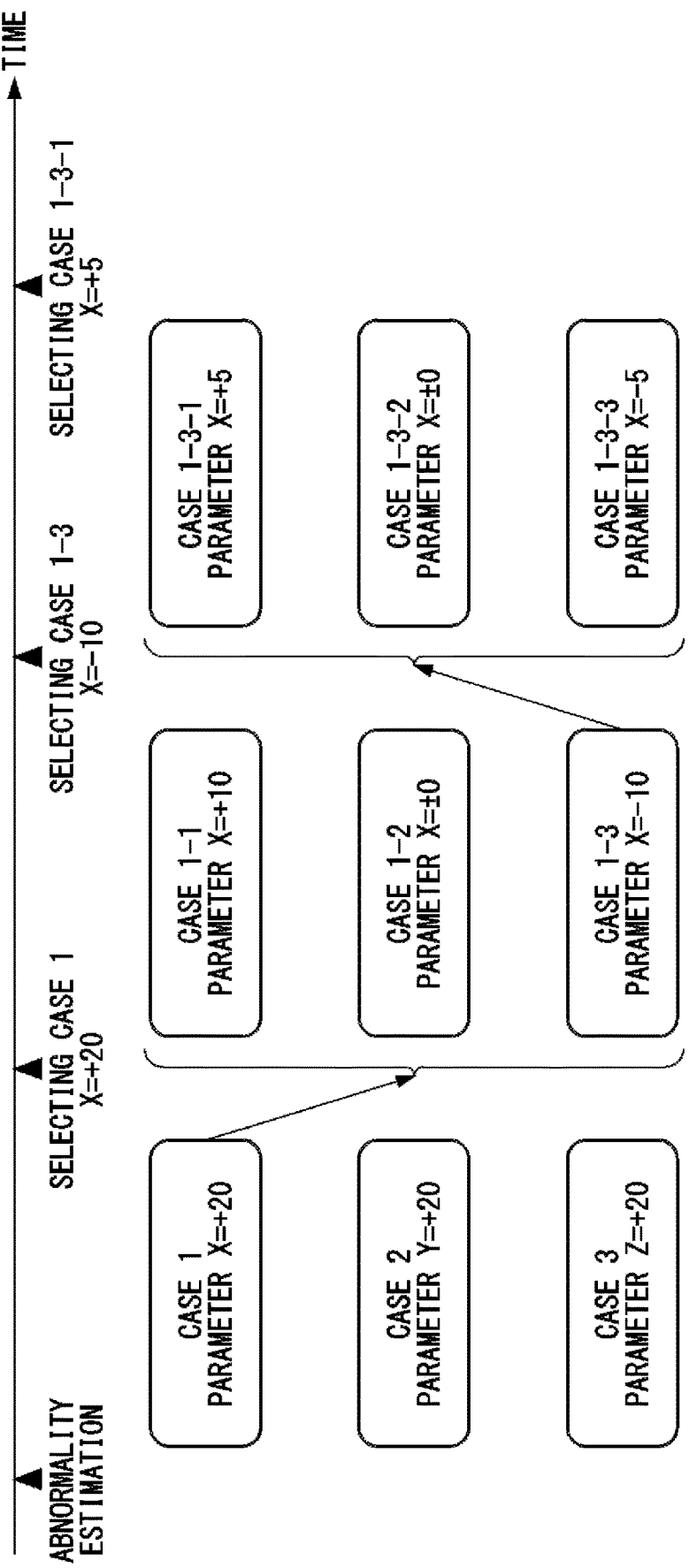
FIG. 6 illustrates one example of selection of a candidate control method according to a variation.

FIG. 6 illustrates one example of the selection of the candidate control method according to a variation of the present embodiment. In this variation, the candidate generation section 150 is configured to generate a plurality of groups of candidate control methods, and the simulation section 160 is configured to sequentially simulate the plurality of candidate control methods belonging to each of the plurality of groups. In the example of this figure, the candidate generation section 150 is configured to generate the first plurality of candidate control methods including cases 1 to 3, the second plurality of candidate control methods including cases 1-1 to 3, and the third plurality of candidate control methods including cases 1-3-1 to 3 in response to the estimated abnormality of the equipment 10. The simulation section 160 starts running the simulation for the first plurality of candidate control methods firstly, the second plurality of candidate control methods next, and the third plurality of candidate control methods after that.

The candidate selection section 175 may select a control method from the first plurality of candidate control methods in response to the completion of the simulation for the first plurality of candidate control methods, before the completion of the simulation for the second plurality of candidate control methods and the subsequent plurality of candidate control methods. The control instruction section 180 is configured to instruct the control apparatus 110 to control the equipment 10 according to the selected control method. Thereafter, the candidate selection section 175 may be configured to select a control method from the candidate control methods including the second plurality of candidate control methods in response to the completion of the simulation for the second plurality of candidate control methods, and the control instruction section 180 may be configured to instruct the control apparatus 110 to control the equipment 10 by the selected control method. Herein, the candidate selection section 175 may select a control method from only the second plurality of candidate control methods that have newly been simulated, or may select a control method from the combination of the first plurality of candidate control methods that have already been simulated and the second plurality of candidate control methods that have newly been simulated.

This allows the control system 100 to run the simulation of a large number of candidate control methods, and once a certain number of candidate control methods have been simulated, a control method can accordingly be selected from the methods to control the equipment 10. The control system 100 can further select control methods from the candidate control methods that have been simulated and update the control of the equipment 10 in response to the further completion of at least a part of the simulation of the remaining candidate control methods. In this way, the control system 100 can improve the control method of the equipment 10 before all the simulations are completed.

Furthermore, in the example of this figure, the candidate generation section 150 is configured to generate the first plurality of candidate control methods, cases 1 to 3, including case 1 as an example of the first candidate control method, and the second plurality of candidate control methods, cases 1-1 to 3, in which the control parameter X to be changed by the case 1 candidate control method is adjusted within a smaller range. Herein, the candidate generation section 150 may generate cases 1-1 to 3 where the control parameter X to be changed by the candidate control method of case 1 is adjusted within a smaller range than case 1 in response to the selection of case 1 from cases 1 to 3. Herein, the candidate generation section 150 may not generate cases in which the control parameters Y to Z to be changed by cases 2 to 3, which have not been selected from cases 1 to 3, are adjusted in a smaller range than cases 2 to 3, and make the simulation be omitted.

In response to the selection of any of the control methods (case 1-3 in the figure) from cases 1-1 to 3, the candidate generation section 150 may generate a third plurality of candidate control methods, cases 1-3-1 to 3, in which the control parameter X is adjusted in an even smaller range may be generated. Herein, if case 1-3-1 has been selected, the control support apparatus 120 can set the control parameter X to +20 by selecting case 1, then set the control parameter X to −10 by selecting case 1-3 (+10 for estimating an abnormality), and then set the control parameter X to +5 by selecting case 1-3-1 (+15 for estimating an abnormality). Note that adjusting in a smaller range means adjusting the control parameter by decreasing the magnitude (absolute value) of the adjustment, such as "+20", "−10", and "+5".

This allows the control support apparatus 120 to select a control method from the first plurality of candidate control methods with different combinations of control parameters to be adjusted, based on the future abnormality of the equipment 10 and the operation target, and then to fine-tune each control parameter included in the selected combination of control parameters by generating a second plurality of candidate control methods, and to further perform the simulation. By repeating this process, the control support apparatus 120 can gradually fine-tune the control parameter to become closer to the appropriate value.

Figure 7:
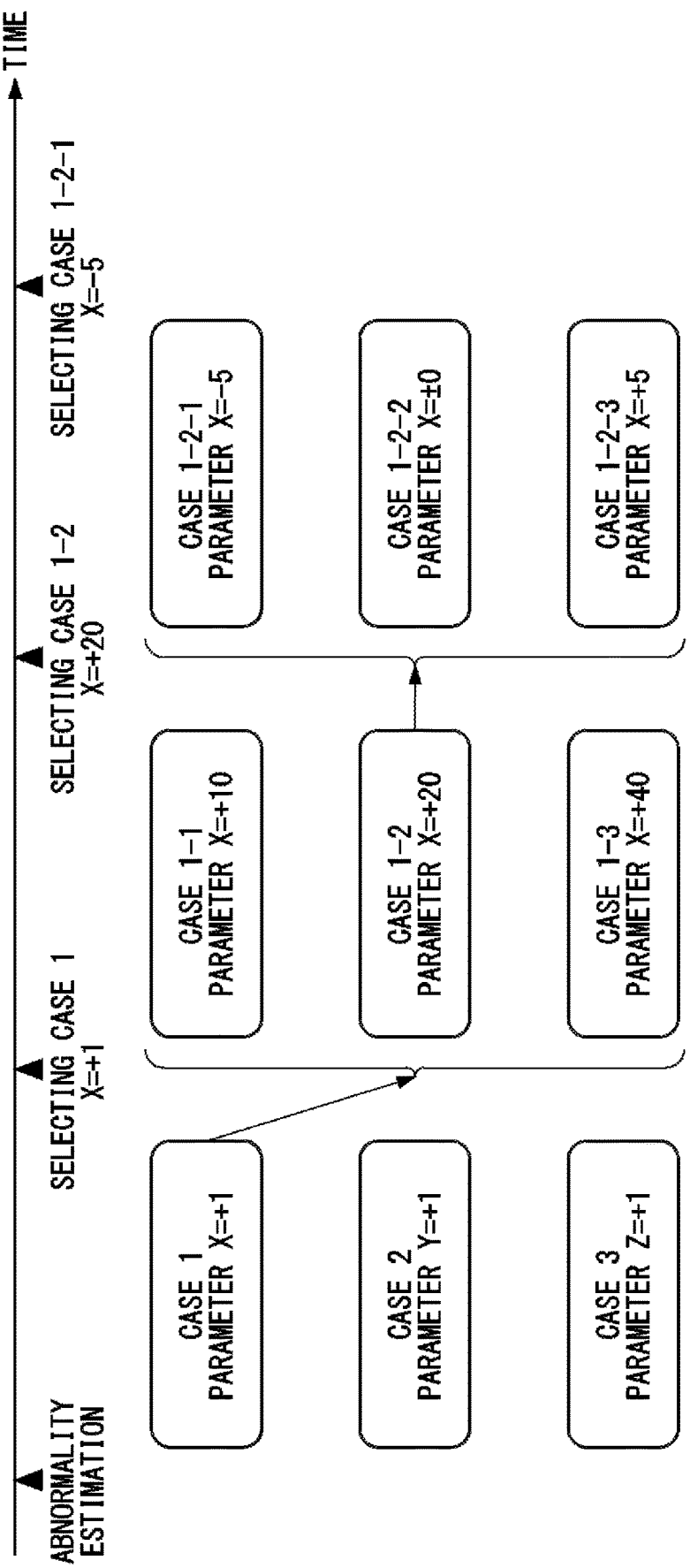
FIG. 7 illustrates one example of selection of a candidate control method according to another variation.

FIG. 7 illustrates one example of the selection of the candidate control method according to another variation of the present embodiment. In the example shown in this figure, the candidate generation section 150 is configured to generate the first plurality of candidate control methods of cases 1 to 3 including case 1 as an example of the first candidate control methods, and the second plurality of candidate control methods including cases 1-1 to 3 as two or more second candidate control methods in which the control parameters to be changed by the candidate control method of case 1 are changed to different magnitudes from each other. Herein, the candidate generation section 150 may generate cases 1-1 to 3 in response to the selection of case 1 from cases 1 to 3.

As one example, the candidate generation section 150 is configured to generate case 1 (control parameter X=+1), case 2 (control parameter Y=+1), and case 3 (control parameter Z=+1), which have different combinations of control parameters from each other and make relatively small changes to the control parameter to be changed, and case 1-1 (parameter X=+10), case 1-2 (parameter X=+20), and case 1-3 (parameter X=+40) are generated according to the fact that case 1 has been selected from them, including the candidate control method that changes the control parameter X changed by case 1 to a larger extent. After this, the candidate generation section 150 may gradually fine-tune the control parameter X to become closer to an appropriate value in the same way as in FIG. 6.

This allows the control support apparatus 120 to identify the combination of the control parameters that should be adjusted to improve the state of the equipment 10, which is estimated to be abnormal, and then adjust the combination of the control parameters. Note that the candidate generation section 150 may include both candidate control methods that increase a certain control parameter and candidate control methods that decrease a certain control parameter in the first plurality of candidate control methods. This allows the control support apparatus 120 to identify the combination of control parameters that should be adjusted to improve the state where the equipment 10 is estimated to be abnormal, and whether each control parameter should be increased or decreased.

Various embodiments of the present invention may be described with reference to a flowchart and a block diagram. Herein, the block may be (1) a step of the process in which the operation is performed, or (2) a section of a device which serves to execute the operation. Certain steps and sections may be implemented by dedicated circuitry, programmable circuitry supplied together with computer readable instructions stored on the computer readable medium, and/or a processor supplied together with computer readable instructions stored on the computer readable medium. The dedicated circuit may include a digital and/or analog hardware circuit, or may include an integrated circuit (IC) and/or a discrete circuit. The programmable circuit may include a reconfigurable hardware circuit including a logical AND, a logical OR, a logical XOR, a logical NAND, a logical NOR, memory elements such as other logical operations, flip-flops, registers, field programmable gate arrays (FPGAs), programmable logic arrays (PLAs), and the like.

Computer readable medium may include any tangible device that can store instructions for execution by a suitable device, such that the computer readable medium having instructions stored thereon comprises a product including instructions which can be executed to create means for performing operations specified in the flowcharts or block diagrams. Examples of the computer-readable medium may include an electronic storage medium, a magnetic storage medium, an optical storage medium, an electromagnetic storage medium, a semiconductor storage medium, or the like. More specific examples of computer-readable medium may include a floppy (registered trademark) disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY (registered trademark) disc, a memory stick, an integrated circuit card or the like The computer-readable instructions may include either source code or object code written in any combination of one or more programming languages, including assembler instructions, instruction set architecture (ISA) instructions, machine instructions, machine-dependent instructions, microcode, firmware instructions, state setting data, or object-oriented programming languages such as Smalltalk (registered trademark), JAVA (registered trademark), C++, etc., and traditional procedural programming languages such as "C" programming languages or similar programming languages.

Computer-readable instructions may be provided to a processor of a general purpose computer, a special purpose computer, or other programmable data processing apparatus such as a computer, or to programmable circuitry, locally or via a local area network (LAN), wide area network (WAN) such as the Internet, etc., and the computer-readable instructions may be executed to create means for performing operations specified in the flowcharts or block diagrams. Examples of the processor include a computer processor, a processing unit, a microprocessor, a digital signal processor, a controller, a microcontroller, or the like.

Figure 8:
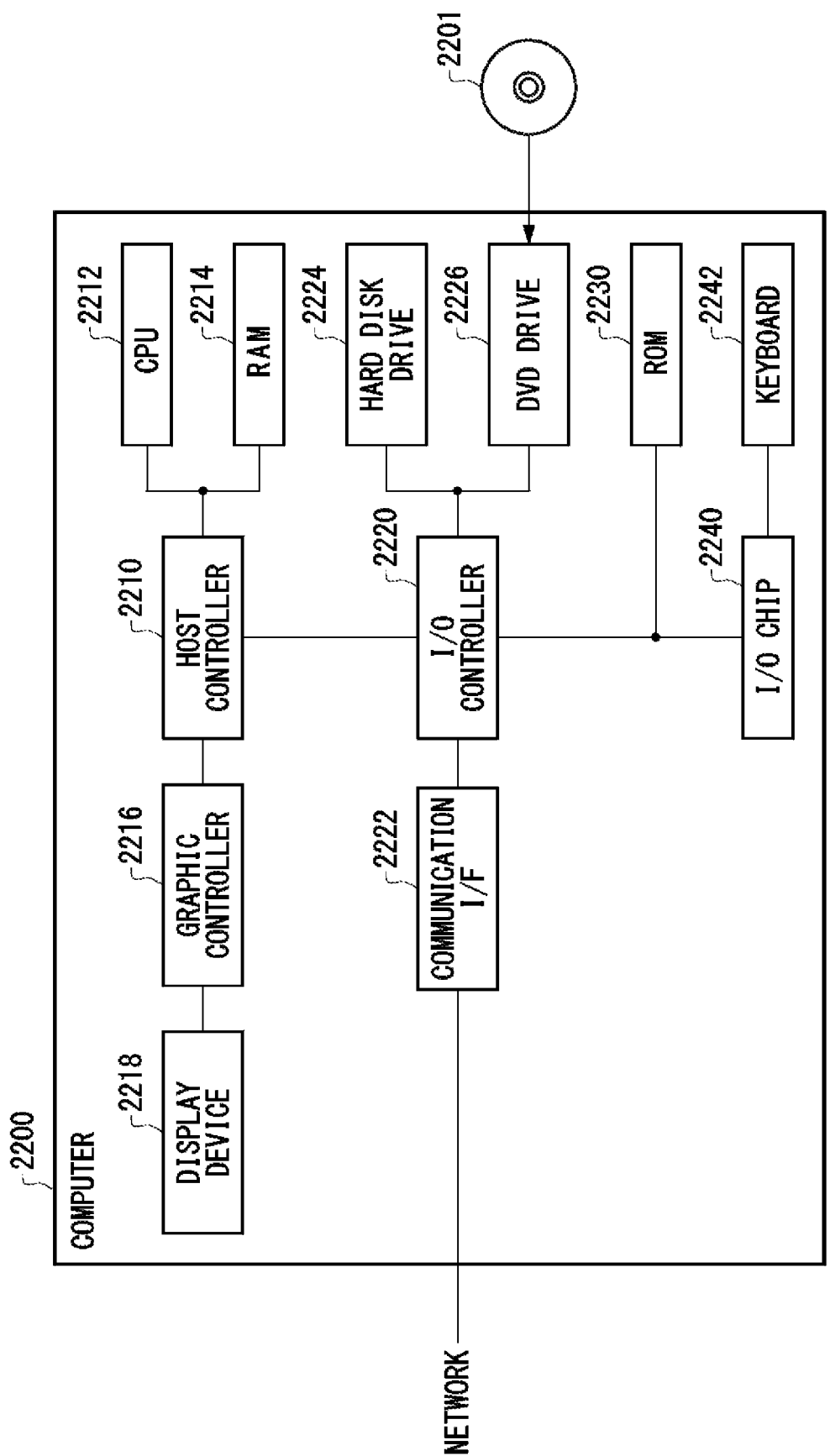
FIG. 8 illustrates an example of a computer 2200 through which a plurality of aspects of the present invention may be entirely or partially embodied.

FIG. 8 illustrates an example of a computer 2200 in which a plurality of aspects of the present invention may be embodied in whole or in part. A program that is installed in the computer 2200 can cause the computer 2200 to function as or perform operations associated with the device according to the embodiments of the present invention or one or more sections of said device, or perform said operations or said one or more sections, and/or can cause the computer 2200 to perform the processes according to the embodiments of the present invention or steps of said processes. Such a program may be executed by a CPU 2212 to have the computer 2200 perform a specific operation associated with some or all of the flowchart and the blocks of the block diagram described in this specification.

The computer 2200 according to the present embodiment includes the CPU 2212, a RAM 2214, a graphics controller 2216, and a display device 2218, which are interconnected by a host controller 2210. The computer 2200 also includes input/output units such as a communication interface 2222, a hard disk drive 2224, a DVD-ROM drive 2226 and an IC card drive, which are connected to the host controller 2210 via an input/output controller 2220. The computer also includes a legacy input/output unit such as a ROM 2230 and a keyboard 2242, which are connected to the input/output controller 2220 via an input/output chip 2240.

The CPU 2212 operates according to a program stored in the ROM 2230 and RAM 2214, thereby controlling each unit. The graphics controller 2216 acquires image data generated by the CPU 2212 in a frame buffer or the like provided in the RAM 2214 or itself, so that the image data is displayed on the display device 2218.

The communication interface 2222 communicates with other electronic devices via the network. The hard disk drive 2224 stores programs and data used by the CPU 2212 in the computer 2200. The DVD-ROM drive 2226 reads the program or data from a DVD-ROM 2201 and provides the program or data to the hard disk drive 2224 via the RAM 2214. The IC card drive reads the program and data from the IC card and/or writes the program and data to the IC card.

The ROM 2230 stores in it a boot program or the like executed by the computer 2200 when activated, and/or a program that depends on the hardware of the computer 2200. The input/output chip 2240 may also connect various input/output units to the input/output controller 2220 via a parallel port, serial port, keyboard port, mouse port, or the like.

The program is provided by a computer-readable medium such as the DVD-ROM 2201 or IC card. The program is read from a computer-readable medium, installed on the hard disk drive 2224, RAM 2214, or ROM 2230 which are also examples of the computer-readable medium, and executed by the CPU 2212. The information processing described in these programs is read on the computer 2200, resulting in cooperation between the program and the various types of hardware resources described above. The device or method may be configured by realizing the operation or processing of information according to the use of the computer 2200.

For example, when communication is executed between the computer 2200 and an external device, the CPU 2212 may execute a communication program loaded onto the RAM 2214 and instruct the communication interface 2222 to perform communication processing based on the processing described in the communication program. Under the control of the CPU 2212, the communication interface 2222 reads transmission data stored in a transmit buffer processing area provided in a recording medium such as the RAM 2214, the hard disk drive 2224, the DVD-ROM 2201, or the IC card, and then transmits the read transmission data to the network or writes reception data received from the network in a receive buffer processing area etc. provided in the recording medium.

In addition, the CPU 2212 may cause all or a necessary portion of a file or a database to be read into the RAM 2214, the file or the database having been stored in an external recording medium such as the hard disk drive 2224, the DVD-ROM drive 2226 (DVD-ROM 2201), the IC card or other, and perform a variety of types of processing on the data on the RAM 2214. The CPU 2212 then writes back the processed data to the external recording medium.

A variety of types of information, such as a variety of types of programs, data, tables, and databases, may be stored in the recording medium to undergo information processing. The CPU 2212 may perform a variety of types of processing on the data read from the RAM 2214, which includes a variety of types of operations, information processing, condition determination, conditional branch, unconditional branch, retrieval/replacement of information or other, as described anywhere throughout this disclosure and designated by an instruction sequence of programs, and writes the result back to the RAM 2214. In addition, the CPU 2212 may retrieve information in a file, a database or other, in a recording medium. For example, if a plurality of entries are stored in the recording medium, where each entry has an attribute value of a first attribute associated with an attribute value of a second attribute, the CPU 2212 may retrieve an entry which matches the condition having a designated attribute value of the first attribute, from among said plurality of entries, and read the attribute value of the second attribute stored in said entry, thereby obtaining the attribute value of the second attribute associated with the first attribute which meets the predetermined condition.

The program or software module described above may be stored on the computer 2200 or in a computer-readable medium near the computer 2200. In addition, a recording medium such as a hard disk or an RAM provided in a server system connected to a dedicated communication network or the Internet can be used as the computer readable medium, thereby providing the program to the computer 2200 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A control support apparatus, comprising:
   at least one processor;

an equipment abnormality estimation section of the at least one processor configured to estimate an abnormality of equipment based on measurement data by measuring the equipment;
a simulation section of the at least one processor configured to simulate a future state of the equipment when controlling the equipment by each of a first plurality of candidate control methods according to an abnormality estimation result of the equipment;
a simulation abnormality estimation section of the at least one processor configured to estimate a future abnormality of the equipment based on a future state of the equipment for each of the first plurality of candidate control methods; and
a control instruction section of the at least one processor configured to instruct a control apparatus of the equipment to control the equipment by a selected first control method based on a simulation result from the first plurality of candidate control methods, wherein
the simulation section is further configured to perform a simulation for the first plurality of candidate control methods and a second plurality of candidate control methods,
the control instruction section is further configured to instruct,
the control apparatus to control the equipment by a selected first control method from the first plurality of candidate control methods, before a completion of a simulation for the second plurality of candidate control methods, in response to a completion of a simulation for the first plurality of candidate control methods, and
the control apparatus to again control the equipment by a selected second control method selected from the second plurality of candidate control methods, in response to a completion of a simulation for the second plurality of candidate control methods.

2. The control support apparatus according to claim 1, wherein:
the control instruction section is further configured to instruct the control apparatus to control the equipment by the selected first control method based on a future abnormality of the equipment according to each of the first plurality of candidate control methods.

3. The control support apparatus according to claim 1, wherein:
the equipment abnormality estimation section and the simulation abnormality estimation section are further configured to estimate an abnormality of the equipment using a same estimation model.

4. The control support apparatus according to claim 1, further comprising:
a factor detection section of the at least one processor configured to detect a factor parameter that has caused an abnormality of the equipment; and
a candidate generation section of the at least one processor configured to generate the selected first control method for normalizing the factor parameter as at least one of the first plurality of candidate control methods.

5. The control support apparatus according to claim 1, further comprising:
a target acquisition section of the at least one processor configured to acquire an operation target of the equipment; and
a candidate selection section of the at least one processor configured to select a candidate control method that satisfies the operation target from the first plurality of candidate control methods.

6. The control support apparatus according to claim 1, further comprising:
a presenting section of the at least one processor configured to present an estimated abnormality by the simulation abnormality estimation section for at least one candidate control method from the first plurality of candidate control methods.

7. The control support apparatus according to claim 1, further comprising a candidate generation section of the at least one processor configured to generate the first plurality of candidate control methods including a first candidate control method, and the second plurality of candidate control methods including a second candidate control method for adjusting a control parameter modified by the first candidate control method in a smaller range.

8. The control support apparatus according to claim 7, wherein the candidate generation section is further configured to generate the second plurality of candidate control methods including the second candidate control method in response to a selection of the first candidate control method.

9. The control support apparatus according to claim 1, further comprising a candidate generation section of the at least one processor configured to generate the first plurality of candidate control methods including a first candidate control method, and the second plurality of candidate control methods including two or more second candidate control methods for changing control parameters that are changed by the first candidate control method into different magnitudes from each other.

10. The control support apparatus according to claim 9, wherein the candidate generation section is further configured to generate the second plurality of candidate control methods including two or more of the second candidate control methods in response to a selection of the first candidate control method.

11. A control support apparatus, comprising:
at least one processor;
an equipment abnormality estimation section of the at least one processor to estimate an abnormality of equipment based on measurement data by measuring the equipment;
a simulation section of the at least one processor to simulate a future state of the equipment when controlling the equipment by each of a first plurality of candidate control methods according to an abnormality estimation result of the equipment; and
a control instruction section of the at least one processor to instruct a control apparatus of the equipment to control the equipment by a selected first control method selected based on a simulation result from the first plurality of candidate control methods, wherein
the simulation section is further configured to perform a first simulation for the first plurality of candidate control methods and a second plurality of candidate control methods,
the control instruction section is further configured to instruct,
the control apparatus to control the equipment by a selected first control method from the first plurality of candidate control methods, before a completion of a second simulation for the second plurality of candidate control methods, in response to a completion of the first simulation for the first plurality of candidate control methods, and
the control apparatus to again control the equipment by a selected second control method selected from the second plurality of candidate control methods, in response to a completion of the second simulation for the second plurality of candidate control methods.

12. A control system, comprising:
the control apparatus for controlling equipment; and
the control support apparatus according to claim 1.

13. A control support method, comprising:
estimating an abnormality of equipment by a control support apparatus for supporting controlling the equipment based on measurement data by measuring the equipment;
firstly simulating, by the control support apparatus, a future state of the equipment when the equipment is controlled by each of a first plurality of candidate control methods according to an abnormality estimation result of the equipment;
secondly simulating, by the control support apparatus, another future state of the equipment when the equipment is controlled by each of a second plurality of candidate control methods different from the first plurality of candidate control methods, according to the abnormality estimation result of the equipment;
firstly instructing, after the firstly simulating but before the secondly simulating completes, by the control support apparatus, a control apparatus of the equipment to control the equipment by a first control method selected based on a first simulation result from the first plurality of candidate control methods; and
secondly instructing, after the secondly simulating completes, by the control support apparatus, the control apparatus of the equipment to control the equipment by a second control method different from the first control method and included in the second plurality of candidate control methods, in response to a completion of a second simulation result from the second plurality of candidate control methods.

14. A computer-readable medium having recorded thereon a control support program that, when executed by a computer, causes the computer to perform operations comprising:

estimating an abnormality of equipment by a control support apparatus for supporting controlling the equipment based on measurement data by measuring the equipment;
simulating, by the control support apparatus, a future state of the equipment if the equipment is controlled by each of a first plurality of candidate control methods according to an abnormality estimation result of the equipment;
instructing, by the control support apparatus, a control apparatus of the equipment to control the equipment by a selected first control method selected based on a first simulation result from the first plurality of candidate control methods; and
a control instruction section of the at least one processor configured to instruct a control apparatus of the equipment to control the equipment by a selected first control method based on the first simulation result from the first plurality of candidate control methods, wherein
the simulation section is further configured to perform a simulation for the first plurality of candidate control methods and a second plurality of candidate control methods,
the control instruction section is further configured to instruct,
the control apparatus to control the equipment by the selected first control method from the first plurality of candidate control methods, before a completion of a simulation for the second plurality of candidate control methods, in response to a completion of the simulation for the first plurality of candidate control methods, and
the control apparatus to again control the equipment by a selected second control method selected from the second plurality of candidate control methods, in response to a completion of a second simulation for the second plurality of candidate control methods.

* * * * *